United States Patent [19]
Yates et al.

[11] Patent Number: 5,399,996
[45] Date of Patent: Mar. 21, 1995

[54] CIRCUIT AND METHOD FOR MINIMIZING ELECTROMAGNETIC EMISSIONS

[75] Inventors: Joseph W. Yates; Michael S. Cosson, both of Duluth, Ga.

[73] Assignee: AT&T Global Information Solutions Company, Dayton, Ohio

[21] Appl. No.: 106,884

[22] Filed: Aug. 16, 1993

[51] Int. Cl.$^6$ .................. H01L 27/00; H03B 1/00
[52] U.S. Cl. ...................................... 331/74; 331/60; 331/158; 331/DIG. 3; 307/91; 327/310; 327/551
[58] Field of Search ............ 331/60, 74, 75, 105, 331/67, 116 R, 116 FE, 158, DIG. 3; 328/162, 164, 165; 307/542, 89, 90, 91; 375/99; 333/12

[56] References Cited

U.S. PATENT DOCUMENTS

| | | | |
|---|---|---|---|
| 3,172,050 | 3/1965 | Ingle | 307/542 X |
| 4,972,414 | 11/1990 | Borkenhagen et al. | 371/22.3 |
| 5,057,708 | 10/1991 | Tagami et al. | 307/303 |
| 5,095,267 | 3/1992 | Merrill et al. | 324/158 R |
| 5,187,453 | 2/1993 | Aoyagi et al. | 331/116 FE |

FOREIGN PATENT DOCUMENTS

| | | | |
|---|---|---|---|
| 0064406 | 5/1980 | Japan | 331/116 FE |
| 0188203 | 10/1984 | Japan | 331/158 |
| 0296261 | 12/1988 | Japan | 307/542 |
| 0126718 | 5/1990 | Japan | 307/542 |
| 3058544 | 3/1991 | Japan | 307/542 |
| 4057514 | 2/1992 | Japan | 307/542 |
| 405075551 | 3/1993 | Japan | 328/165 |

Primary Examiner—Robert J. Pascal
Assistant Examiner—Arnold Kinkead
Attorney, Agent, or Firm—Paul W. Martin

[57] ABSTRACT

A circuit and method for minimizing electromagnetic emissions which employ a cancellation signal to produce electromagnetic fields which are opposites of the fields produced by the digital circuit. The circuit and method of the present invention are particularly suited for use in digital systems which produce constant-frequency and constant-amplitude clock signals for driving a circuit load. The circuit includes a cancellation circuit for producing the cancellation signal, which may include the same oscillator used to produce the clock signal. An amplitude-adjust circuit adjusts the amplitude of the cancellation signal, and a phase-adjust circuit adjusts the phase of the cancellation signal.

15 Claims, 1 Drawing Sheet

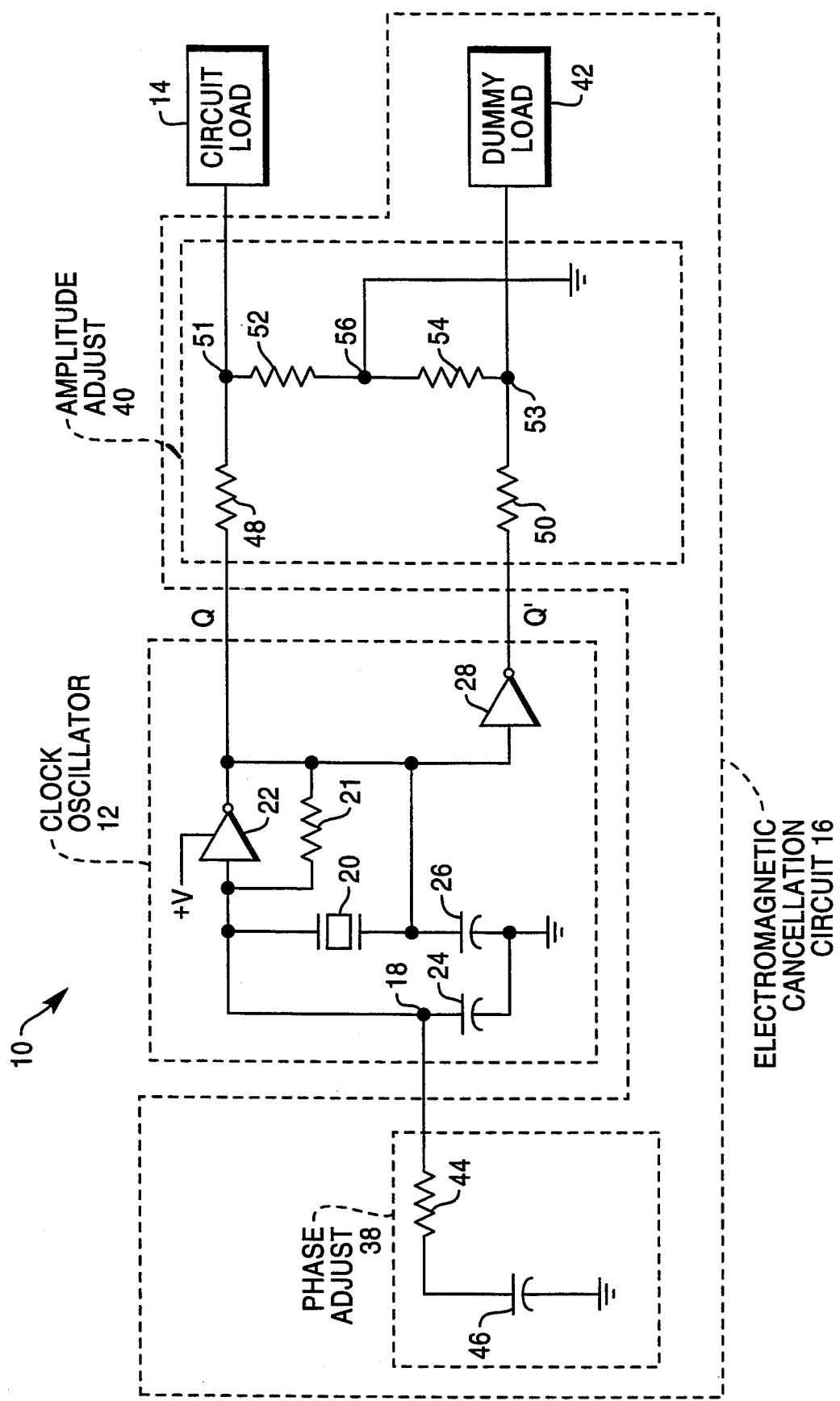

CIRCUIT AND METHOD FOR MINIMIZING ELECTROMAGNETIC EMISSIONS

BACKGROUND OF THE INVENTION

The present invention relates to electromagnetic emissions, and more specifically to a circuit and method for minimizing electromagnetic emissions.

Electromagnetic Compatibility (EMC) is an important phase of releasing any high-speed digitally-clocked products. Passing EMC tests of the FCC, CISPR, and other regulatory agencies usually dictates a significant portion of the digital design, as well as the circuit board layout. Most engineers will confess that EMC is difficult and costly to achieve.

Known methods for achieving EMC involve adding shielding components, or they may even involve totally redesigning the circuit.

Conventional oscillators used to clock digital chips have four pins, three of which are used. One of the three used outputs provides the clock signal as well as harmonic frequencies. Any one of these frequencies may cause problems with EMC, as the printed circuit board traces act as antennae for radiating the frequencies.

Therefore, it would be desirable to provide a circuit and method for minimizing electromagnetic emissions in digital products.

SUMMARY OF THE INVENTION

In accordance with the teachings of the present invention, a circuit and method for minimizing electromagnetic emissions are provided. The circuit and method of the present invention are particularly suited for use in digital systems which produce constant-frequency and constant-amplitude clock signals for driving a circuit load.

The circuit includes a cancellation circuit for producing a cancellation signal which is 180 degrees out of phase with the clock signal and which has the same amplitude as the clock signal. The cancellation circuit may include an oscillator for producing the cancellation signal, an amplitude-adjust circuit coupled to the oscillator for adjusting the amplitude of the cancellation signal, and a phase-adjust circuit means coupled to the oscillator for adjusting the phase of the cancellation signal.

The oscillator is preferably the same oscillator used to provide the clock signal. Thus, the oscillator includes a clock signal output terminal, a cancellation signal output terminal, and a phase-adjust tap. The cancellation signal output terminal is provided by coupling an inverter between the clock signal output terminal and the cancellation signal output terminal.

The circuit of the present invention also includes a dummy load circuit coupled to the cancellation circuit means which has the same impedance as the circuit load. Preferably, the cancellation circuit and the dummy load circuit are located in close proximity to the digital circuit and the circuit load.

It is accordingly an object of the present invention to provide a circuit and method for minimizing electromagnetic emissions in digital circuits.

It is another object of the present invention to provide a circuit and method for minimizing electromagnetic emissions in digital circuits which employ a cancellation signal to produce electromagnetic fields which are opposites of the fields produced by the digital circuit.

It is another object of the present invention to provide a circuit and method for minimizing electromagnetic emissions in digital circuits which employ a single oscillator to produce the clock signal and the cancellation signal.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawing, in which the FIGURE is a partial schematic diagram of a digital circuit employing the electromagnetic emissions cancellation circuit of the present invention.

DETAILED DESCRIPTION OF THE PREFERRED EMBODIMENT

Referring now to FIG. 1, digital circuit 10 includes clock oscillator 12, circuit load 14, and electromagnetic cancellation circuit 16.

Known clock oscillators produce only a clock output Q. Under the present invention, oscillator 12 produces a clock output Q and an inverted clock output Q'. Preferably, clock oscillator 12 has a phase adjust tap 18 as well.

As shown in FIG. 1, oscillator 12 includes crystal 20, resistor 21, inverter 22, and capacitors 24 and 26, which operate in a known manner to produce clock output Q. Other oscillator configurations are also envisioned by the present invention. Inverter 28 is added to produce inverted clock output Q'.

Electromagnetic cancellation circuit 16 includes phase adjust circuit 38, amplitude adjust circuit 40, and dummy load 42.

Phase adjust circuit 38 adjusts the phase of inverted clock output Q' so that inverted clock output Q' and clock output Q are in phase. Phase adjust circuit 38 may be added to a known oscillator configuration by tapping into an appropriate point in the oscillator circuit. Phase adjust circuit 38 may include a resistor-capacitor or resistor-inductor combination, depending upon the measured lag or lead at point 18. FIG. 1 shows a phase adjust circuit 38 having resistor 44 and capacitor 46.

Amplitude adjust circuit 40 adjusts the amplitude of inverted clock output Q' to equal the amplitude of clock output Q. Amplitude adjust circuit 40 preferably includes passive elements, such as resistors.

FIG. 1 shows an amplitude adjust circuit having resistors 48–54. Resistors 48 and 50 determine the output resistance at points 51 and 53. Resistors 48 and 50 may be part of oscillator 12. Resistors 52 and 54 are coupled in series between resistors 48 and 50. Point 56 between resistors 52 and 54 is grounded.

Resistors 52 and 54 are determined independently by measuring the peak voltages at points 51 and 53. If the voltage at either point is less than a predetermined voltage, then the associated resistance is increased to a resistance value that will yield the predetermined voltage. If the voltage at either point is greater than the predetermined voltage, then the associated resistance is decreased to a resistance value that will yield the predetermined voltage.

Dummy load 42 is substantially equal to circuit load 14.

With both phase and amplitude adjustments, the electromagnetic interference produced by circuit load 14 may be minimized by the electromagnetic interference produced by dummy load 42. Preferably, dummy load 42 and its associated wiring are located as close as possible to circuit load 14 and its associated wiring. Advantageously, when circuit 10 is fabricated on a chip, variation in circuit elements is uniform and interference is minimized.

Although the present invention has been described with particular reference to certain preferred embodiments thereof, variations and modifications of the present invention can be effected within the spirit and scope of the following claims.

What is claimed is:

1. An emissions reduction circuit for minimizing an electromagnetic field from and along a digital circuit which produces a clock signal having an amplitude and which has a circuit load having an impedance, comprising:
   cancellation circuit means for producing a cancellation signal, which has an amplitude equal to the amplitude of the clock signal, which is 180 degrees out of phase with the clock signal, and which produces another electromagnetic field, including an oscillator for producing the clock signal and the cancellation signal, amplitude circuit means coupled to the oscillator for adjusting the amplitudes of the clock signal and the cancellation signal, and phase circuit means coupled to the oscillator for adjusting the phase of the cancellation signal; and
   a dummy load circuit coupled to the cancellation circuit means which has an impedance equal to the impedance of the circuit load;
   wherein the cancellation circuit means and the dummy load circuit are located in close proximity to the digital circuit and the circuit load so that the electromagnetic field from and along the digital circuit is minimized by the other electromagnetic field from and along the cancellation circuit.

2. The emissions reduction circuit as recited in claim 1, wherein the cancellation circuit means comprises:
   an oscillator coupled to the amplitude circuit means for producing the cancellation signal; and
   phase circuit means coupled to the oscillator for adjusting the phase of the cancellation signal.

3. The emissions reduction circuit as recited in claim 2, wherein the oscillator also produces the clock signal and the amplitude circuit means also adjusts the amplitude of the clock signal.

4. The emissions reduction circuit as recited in claim 3, wherein the oscillator comprises:
   a clock signal output terminal for producing the clock signal;
   a cancellation signal output terminal for producing the cancellation signal; and
   an inverter between the clock signal output terminal and the cancellation signal output terminal.

5. The emissions reduction circuit as recited in claim 1, wherein the amplitude circuit means comprises:
   a first resistor having first and second ends, the first end being coupled to the clock signal output terminal;
   a second resistor having first and second ends, the first end being coupled to the cancellation signal output terminal and the second end being coupled to the second end of the first resistor; and
   a ground coupled to the second ends of the first and second resistors.

6. The emissions reduction circuit as recited in claim 5, wherein the oscillator further comprises:
   a clock signal output resistor coupled to the first end of the first resistor through the clock signal output terminal; and
   a cancellation signal output resistor coupled to the first end of the second resistor through the cancellation signal output terminal.

7. The emissions reduction circuit as recited in claim 5, wherein the amplitude circuit means further comprises:
   a third resistor coupled between the clock terminal and the first end of the first resistor; and
   a fourth resistor coupled between the cancellation terminal and the first end of the second resistor.

8. The emissions reduction circuit as recited in claim 3, wherein the phase circuit means comprises:
   a resistor coupled to the oscillator;
   a ground; and
   a capacitor coupled between the resistor and the ground.

9. The emissions reduction circuit as recited in claim 3, wherein the phase circuit means comprises:
   a resistor coupled to the oscillator;
   a ground; and
   an inductor coupled between the resistor and the ground.

10. A method for minimizing an electromagnetic field from a digital circuit which produces a clock signal having an amplitude and which has a circuit load having an impedance, comprising the steps of:
    providing a cancellation circuit having a dummy load which has an impedance equal to the impedance of the circuit load, and including an amplitude circuit;
    producing a cancellation signal for driving the cancellation circuit which is 180 degrees out of phase with the clock signal, which has an amplitude, and which produces another electromagnetic field;
    adjusting the amplitudes of the cancellation signal and the clock signal by the amplitude circuit to a common amplitude; and
    locating the cancellation circuit in close proximity to the digital circuit so that the electromagnetic field from and along the digital circuit is minimized by the electromagnetic field from and along the cancellation circuit.

11. The method as recited in claim 10, wherein the step of producing a cancellation signal comprises the substep of:
    providing an oscillator having a cancellation signal output terminal, and a phase-adjust tap.

12. The method as recited in claim 10, wherein the step of producing a cancellation signal comprises the substep of:
    providing an oscillator having a clock signal output terminal, a cancellation signal output terminal, and a phase-adjust tap.

13. An emissions reduction circuit for minimizing electromagnetic emissions from a digital circuit which produces a clock signal having an amplitude and which has a circuit load having an impedance, comprising:
    cancellation circuit means for producing a cancellation signal which is 180 degrees out of phase with the clock signal and which has an amplitude equal to the amplitude of the clock signal including an oscillator for producing the cancellation signal and the clock signal, amplitude circuit means coupled to the oscillator for adjusting the amplitude of the clock signal and the cancellation signal, and phase circuit means coupled to the oscillator for adjusting the phase of the cancellation signal; and a dummy load circuit coupled to the cancellation circuit means which has an impedance equal to the impedance of the circuit load;

wherein the oscillator includes a clock signal output terminal for producing the clock signal, a cancellation signal output terminal for producing the cancellation signal, and an inverter between the clock signal output terminal and the cancellation signal output terminal; and wherein the amplitude adjusting means includes a first resistor having first and second ends in which the first end is coupled to the clock signal output terminal, a second resistor having first and second ends in which the first end is coupled to the cancellation signal output terminal and the second end being coupled to the second end of the first resistor, and a ground coupled to the second ends of the first and second resistors.

14. The emissions reduction circuit as recited in claim 13, wherein the oscillator further comprises:
   a clock signal output resistor coupled to the first end of the first resistor through the clock signal output terminal; and
   a cancellation signal output resistor coupled to the first end of the second resistor through the cancellation signal output terminal.

15. The emissions reduction circuit as recited in claim 13, wherein the amplitude circuit means further comprises:
   a third resistor coupled between the clock signal output terminal and the first end of the first resistor; and
   a fourth resistor coupled between the cancellation signal output terminal and the first end of the second resistor.

* * * * *

UNITED STATES PATENT AND TRADEMARK OFFICE
CERTIFICATE OF CORRECTION

PATENT NO. : 5,399,996
DATED : March 21, 1995
INVENTOR(S) : Joseph Yates et al.

It is certified that error appears in the above-indentified patent and that said Letters Patent is hereby corrected as shown below:

Column 4, line 31, after "from" insert
--and along--.

Signed and Sealed this

Seventeenth Day of October, 1995

Attest:

BRUCE LEHMAN

*Attesting Officer*     *Commissioner of Patents and Trademarks*